United States Patent
Maidee

(10) Patent No.: US 12,406,121 B2
(45) Date of Patent: Sep. 2, 2025

(54) 3D INTEGRATED CIRCUIT WITH ENHANCED DEBUGGING CAPABILITY

(71) Applicant: Xilinx, Inc., San Jose, CA (US)

(72) Inventor: Pongstorn Maidee, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 558 days.

(21) Appl. No.: 17/810,547

(22) Filed: Jul. 1, 2022

(65) Prior Publication Data

US 2024/0005074 A1 Jan. 4, 2024

(51) Int. Cl.
| | |
|---|---|
| G06F 30/333 | (2020.01) |
| G01R 31/28 | (2006.01) |
| G01R 31/317 | (2006.01) |
| G06F 30/3308 | (2020.01) |
| G06F 30/343 | (2020.01) |
| G06F 30/367 | (2020.01) |
| H01L 21/768 | (2006.01) |
| H01L 23/528 | (2006.01) |
| H01L 21/66 | (2006.01) |

(52) U.S. Cl.
CPC ....... *G06F 30/333* (2020.01); *G01R 31/2889* (2013.01); *G06F 30/343* (2020.01); *G01R 31/31702* (2013.01); *G01R 31/31704* (2013.01); *G01R 31/31705* (2013.01); *G06F 30/3308* (2020.01); *G06F 30/367* (2020.01); *H01L 21/768* (2013.01); *H01L 22/30* (2013.01); *H01L 23/528* (2013.01)

(58) Field of Classification Search
CPC .. G06F 30/333; G06F 30/343; G06F 30/3308; G06F 30/367; G01R 31/2889; G01R 31/31702; G01R 31/31704; G01R 31/31705; H01L 21/768; H01L 22/30; H01L 23/528
USPC ....... 716/136, 106, 111; 703/14; 326/16, 47, 326/101; 257/48
See application file for complete search history.

(56) References Cited

U.S. PATENT DOCUMENTS

| | | | | |
|---|---|---|---|---|
| 5,987,893 | A | * 11/1999 | Schulz-Harder | ........ H01L 23/38 257/E23.098 |
| 5,995,744 | A | 11/1999 | Guccione | |
| 6,212,650 | B1 | 4/2001 | Guccione | |
| 6,985,980 | B1 | 1/2006 | Allegrucci | |
| 7,308,564 | B1 | 12/2007 | Jenkins, IV | |
| 7,622,947 | B1 | * 11/2009 | Danskin | ............... G11C 29/848 326/38 |
| 7,805,593 | B1 | 9/2010 | Donlin | |
| 8,203,177 | B2 | * 6/2012 | Shin | ................... G11C 16/0483 257/314 |
| 8,327,200 | B1 | 12/2012 | Mohan | |
| 8,595,555 | B1 | 11/2013 | Taylor | |
| 8,595,561 | B1 | 11/2013 | Lu et al. | |
| 9,188,638 | B2 | * 11/2015 | Hopkins | .......... G01R 31/31727 |

(Continued)

OTHER PUBLICATIONS

Wang, Chinese Patent Document No. CN-113782445-A, published Dec. 10, 2021, 3 pages including abstract and claims. (Year: 2021).*

(Continued)

*Primary Examiner* — Phallaka Kik
(74) *Attorney, Agent, or Firm* — Kevin T. Cuenot

(57) ABSTRACT

An integrated circuit includes a plurality of layers. A subset of the plurality of layers is reserved for implementing user circuitry. At least a portion of a selected layer of the plurality of layers is reserved for debugging.

16 Claims, 9 Drawing Sheets

(56) References Cited

U.S. PATENT DOCUMENTS

| | | |
|---|---|---|
| 10,067,854 B2 | 9/2018 | Villarreal et al. |
| 10,110,234 B1 | 10/2018 | Durairajan et al. |
| 10,161,999 B1 | 12/2018 | Nand et al. |
| 10,235,272 B2 | 3/2019 | Villarreal et al. |
| 2005/0242271 A1* | 11/2005 | Weng .................. H10F 39/8053 250/214.1 |
| 2015/0226795 A1* | 8/2015 | Hopkins ............. G06F 11/3648 714/726 |

OTHER PUBLICATIONS

Cristinel Ababei, et al., Exploring Potential Benefits of 3D FPGA Integration, J. Becker, M. Platzner, S. Vernalde (Eds.): FPL 2004, LNCS 3203, pp. 874-880, 2004.

* cited by examiner

1000

Receive a plurality of probes for user circuitry implemented within one of a plurality of three-dimensional integrated circuits (3D ICs)
1002

Partition the plurality of probes into a plurality of subsets, wherein each subset corresponds to a different one of the plurality of 3D ICs
1004

Place debug circuitry within respective ones of the different debug sections of the plurality of 3D ICs
1006

Route the plurality of subsets of probe points to the placed debug circuitry for respective ones of the plurality of 3D ICs.
1008

FIG. 10

3D INTEGRATED CIRCUIT WITH ENHANCED DEBUGGING CAPABILITY

TECHNICAL FIELD

This disclosure relates to integrated circuits (ICs) and, more particularly, to 3-dimensional (3D) ICs that provide an enhanced debugging capability.

BACKGROUND

In cases where a circuit design for a target IC does not behave as expected, the circuit design, as implemented in the target IC may be debugged. In the case of programmable ICs, debugging often includes adding debug circuitry to the existing circuit design and implementing the modified circuit design anew in the target IC. Early in the development process, debug circuitry may be added to the circuit design with less friction as the circuit design tends to be incomplete and the target IC includes unused space for implementing the debug circuitry. As the circuit design matures, adding debug circuitry may be difficult in view of limited available space on the target IC and the inability to route probes due to high levels of congestion on the target IC.

Thus, in later development stages, inclusion of debug circuitry requires changes to the placement and routing of the circuit design. Such changes are often non-trivial in nature and perturb the state of the implementation of the circuit design. Unfortunately, modifying the circuit design, even if only to add debug circuitry, inevitably alters implementation details of the circuit design in the target IC. The altered implementation details may further change the behavior of the circuit design as implemented in the target IC. In some cases, adding debug circuitry may even mask the problem sought to be corrected through debugging.

SUMMARY

In one or more example implementations, an integrated circuit (IC) includes a plurality of layers. A subset of the plurality of layers is reserved for implementing user circuitry. At least a portion of a selected layer of the plurality of layers is reserved for debugging.

In one or more example implementations, a method includes testing a plurality of layers of a 3-dimensional integrated circuit (3D IC). Each layer is subdivided into a plurality of regions. The regions from one layer to another are aligned within stacked columns. The method includes determining which regions of the plurality of layers are operational. The method includes determining a number of operational regions in each stacked column of regions across the plurality of layers. The method includes, for each stacked column including a number of operational regions exceeding a number of operational regions reserved for user circuitry, designating a selected region of a selected layer of the plurality of layers as a debug region.

In one or more example implementations, a method includes receiving a plurality of probes for user circuitry implemented within one of a plurality of 3D ICs. Each 3D IC provides a different debug section. The method includes partitioning the plurality of probes into a plurality of subsets. Each subset corresponds to a different one of the plurality of 3D ICs. The method includes placing debug circuitry within respective ones of the different debug sections of the plurality of 3D ICs. The method also includes routing the plurality of subsets of probes to the placed debug circuitry for respective ones of the plurality of 3D ICs.

This Summary section is provided merely to introduce certain concepts and not to identify any key or essential features of the claimed subject matter. Other features of the inventive arrangements will be apparent from the accompanying drawings and from the following detailed description.

BRIEF DESCRIPTION OF THE DRAWINGS

The inventive arrangements are illustrated by way of example in the accompanying drawings. The drawings, however, should not be construed to be limiting of the inventive arrangements to only the particular implementations shown. Various aspects and advantages will become apparent upon review of the following detailed description and upon reference to the drawings.

FIG. 10 illustrates an example method of implementing debug circuitry within a 3D IC.

DETAILED DESCRIPTION

Figure 1:
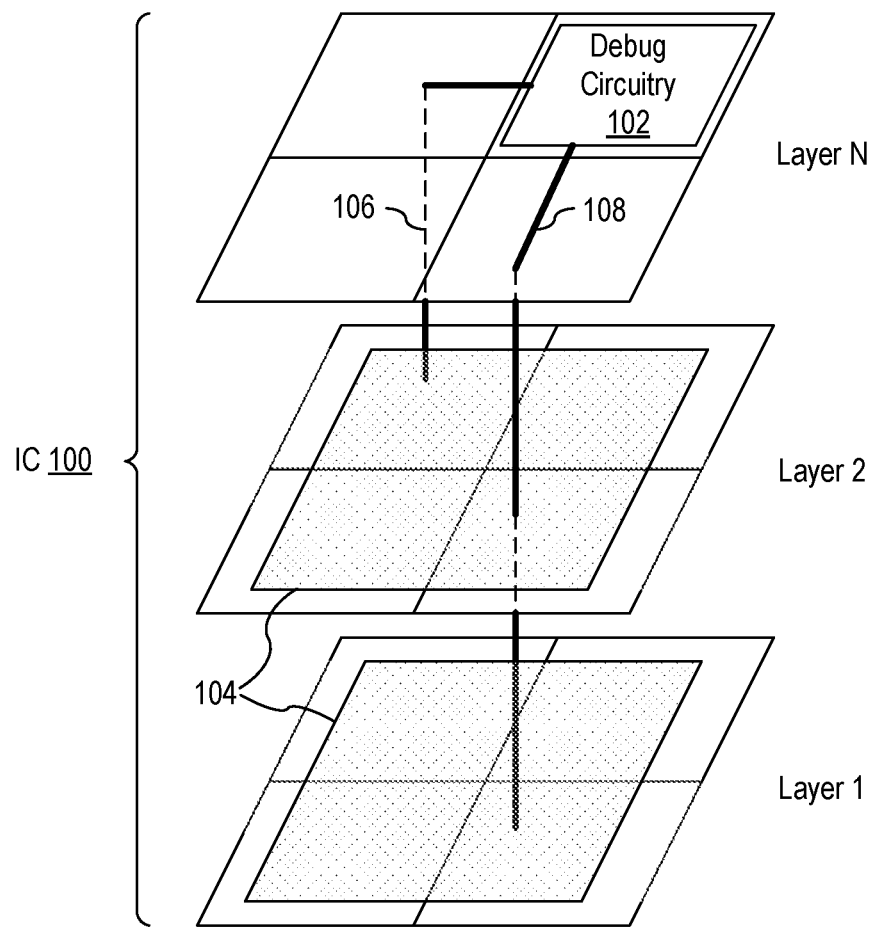
FIG. 1 illustrates an integrated circuit (IC) that includes multiple layers.

This disclosure relates to integrated circuits (ICs) and, more particularly, to ICs that provide enhanced debug capabilities. In accordance with the inventive arrangements described within this disclosure, an IC may include a plurality of layers. One or more or each of the layers of the IC includes programmable circuitry. A selected layer, or one or more portions of the selected layer, of the plurality of layers of the IC may be used for debugging.

In one or more example implementations, an IC that includes N layers may be provided to users as an IC that provides N-M layers, where M and N are integer values and M is less than N. In this example, N represents the total number of layers of the IC. M represents the number of debugging layers in the IC. N-M represents the number of layers, e.g., a subset of the layers, that are available in the IC to implement a user circuit design. The other M layers are traditionally used for redundancy. In the case that a fabricated device does not need all the redundant layers, some of the redundant layers can be used for debugging. For example, an IC that includes three total layers where one layer is to be reserved and used for debugging and two of the layers are to be reserved for implementing user circuitry (e.g., user circuit designs) will have N=3 and M=1.

In one example, where the N−M+I layers include no defects, up to I layers may be reserved for use in implementing debug circuitry for debugging a user circuit design implemented using the N−M layers of the IC. That is, an entirety of the I layer(s) may be reserved for debugging. In each case, these layers may be hidden from the user by the Electronic Design Automation (EDA) tools during implementation of the user's circuit design. These layers may only be available or visible by way of the EDA tools for purposes of debugging. Because the debug circuitry is implemented in an entirely different layer of the IC than the user circuit design, the user's circuit design may be debugged with little or no disturbance in the placement and/or routing of the user's circuit design as implemented in the IC.

In another example, the layers of the IC may be subdivided into regions such that a region in one layer may be used in place of another region that contains a defect in different layer. In that case, rather than using the entirety of a layer for debugging, one or more regions of a layer may be used for debugging. In this manner, debug circuitry may be added to a user circuit design even in cases where the user's circuit design consumes significant resources (e.g., programmable circuitry and routing resources) of the N−M layers of the IC. The debug circuitry may be added in many cases without the need to change the placement and/or routing of the user's circuit design as implemented in the IC.

The inventive arrangements facilitate debugging of circuit designs where debugging otherwise may not have been feasible. Further, the inventive arrangements allow debugging to be performed with less time being devoted to operations such as placement and routing since the user's circuit design need not be disturbed in many cases. Further aspects of the inventive arrangements are described below with reference to the figures.

FIG. 1 illustrates an IC 100 that includes multiple layers 1, 2, . . . through N. IC 100 is implemented as a multi-layered IC, which is also referred to herein as a 3-dimensional (3D) IC. In the example, each of layers 1 through N represents a layer that is capable of implementing active devices (e.g., transistors). IC 100 may be implemented using any of a variety of 3D integration or stacking technologies. In one or more examples, each layer illustrated in FIG. 1 may be implemented as a die or as a chiplet.

In one or more examples, one or more layers of IC 100 include programmable circuitry. In other examples, each of the layers of IC 100 includes programmable circuitry. Programmable logic is an example of programmable circuitry.

In the example of FIG. 1, IC 100 includes three layers (e.g., N=3). The number of layers reserved for implementing user circuit designs or user circuitry is two (e.g., N−M=2). The number of layers that may be reserved for implementing debug circuitry is one (M=1). Within this disclosure, the total number of layers of an IC, the number of layers available for user circuit designs, and/or the number of layers available for debugging are not intended to be limited by the particular examples given. In one or more other examples, an IC may include two total layers or more than three total layers with varying number of layers reserved for implementing user circuitry and varying numbers of layers available for debug circuitry.

Within this disclosure, the term "non-debugging layer" means a layer of an IC that is reserved for implementing all or a portion of a user circuit design. Within this disclosure, the term "debugging layer" means at least a portion of a layer of an IC that is reserved for implementing debug circuitry and that is not available for implementing any portion of a user circuit design. Without loss of generality, examples are described herein using one debugging layer. It should be appreciated that in other examples, more than one debug layer may be available and used.

Referring to FIG. 1 in a general case where each layer includes no defects, layer N is the debug layer. Layers 1 and 2 are non-debug layers. For purposes of illustration, it can be assumed that a circuit design 104 (e.g., a user circuit design) is implemented using, at least in part, programmable circuitry in layers 1 and 2. That is, while creating and/or testing circuit design 104, the EDA tools used allow circuit design 104 to be implemented only in layers 1 and 2. In response to determining that the behavior of circuit design 104, as implemented in IC 100, is not as anticipated or expected, debug circuitry 102 may be implemented in programmable circuitry of the debug layer. In the example, debug circuitry 102 is implemented in a selected region of layer N being the debug layer.

In the example, each layer is subdivided into four different regions. Further, probes 106 and 108 have been routed from debug circuitry 102 to particular nodes or signals in circuit design 104 as implemented in IC 100 to capture signals of interest in circuit design 104. Probe 106 obtains a value of a signal from layer 2 of IC 100. Probe 108 obtains a value of a signal from layer 1 of IC 100. As defined within this disclosure, the term "region" means a smallest portion or part of a layer of a IC (e.g., a 3D IC) that is used as a whole in place of another defective region of another layer in the same stacked column of the 3D IC. Thus, a region is defined physically by multiplexing circuitry and/or logic that allows one region to be connected to nearby regions in different stacked columns in addition to the nearby regions in the same layer.

As can be seen from the example of FIG. 1, with circuit design 104 being confined to layers 1 and 2, debug circuitry 102 may be implemented in layer N without interfering with the placement of circuit design 104. Further, the number of routing resources needed in layers 1 and 2 to implement (e.g., route) probes 106 and 108 is reduced. In the example, the probes are routed out from debug circuitry in the debug layer and then directly down to the particular signals of interest in the respective layers shown.

In one or more examples, each region of layer N may be a known good region. A known good region, also referred to as an operational region, is a region of a layer of an IC that does not include a defect as determined from available semiconductor testing equipment and/or techniques. In the case where each region of each layer is an operational region, the particular location (e.g., placement) of debug circuitry 102 within layer N is not restricted.

In one or more other examples, one or more of the regions of layer(s) 1 and/or 2 may include a defect. In that case, a region of the debug layer that is in the same vertical column as the defective region is used in place of the defective region and thus cannot be used for debugging. As a result, the particular region of the debug layer in which debug circuitry 102 is implemented may be limited as described in greater detail in connection with FIG. 2. In other examples, one or more of the regions in a debugging layer may contain defects, limiting where the debug circuitry 102 may be implemented.

In general, debugging does not require full chip accessibility all at one time. Such is the case as adding many routes (e.g., probes for debugging) in an already dense circuit design is often not feasible. Although one (or more) region(s) of layer N may be unusable due to defects therein or a defect in a region below, the other region(s) may be used to deploy debug circuitry to probe signals of circuit design 104. This implementation provides a larger number of accesses or probes than if the debug circuitry were implemented in the same layer(s) as or commingled with, circuit design 104.

Moreover, the multi-layer nature of IC 100 increases the number of locations at which a given signal may be probed. Debug circuitry 102 may be implemented to connect to a node of a signal that is more accessible (e.g., less congested in terms of placement and/or routing). Furthermore, devices with different debug signatures can be used to implement the debug circuitry. The multiple placement options available when using different devices with different debug signatures makes many more signals accessible beyond what are available on a regular device. An example of a debug signature is described in connection with FIG. 3.

In the example of FIG. 1, the probe routing is also largely contained in layer N. Thus, the probe routing, with the exception of vertical routes, is in a separate layer of IC 100 than the routes of circuit design 104. Since the majority of the routing resources in layer N are available, the congestion is low. Thus, the ability to add probes without having to re-route signals of circuit design 104 is high. The general separation of debug circuitry 102 from circuit design 104 and the separation of probes from routes of circuit design 104 leads to less time needed for compilation (e.g., placement and/or routing) than if debug circuitry 102 and probes 106, 108 were implemented in the same layers as circuit design 104 (e.g., where probe routes and/or debug circuitry is commingled with circuit design 104).

Figures 2, 3:
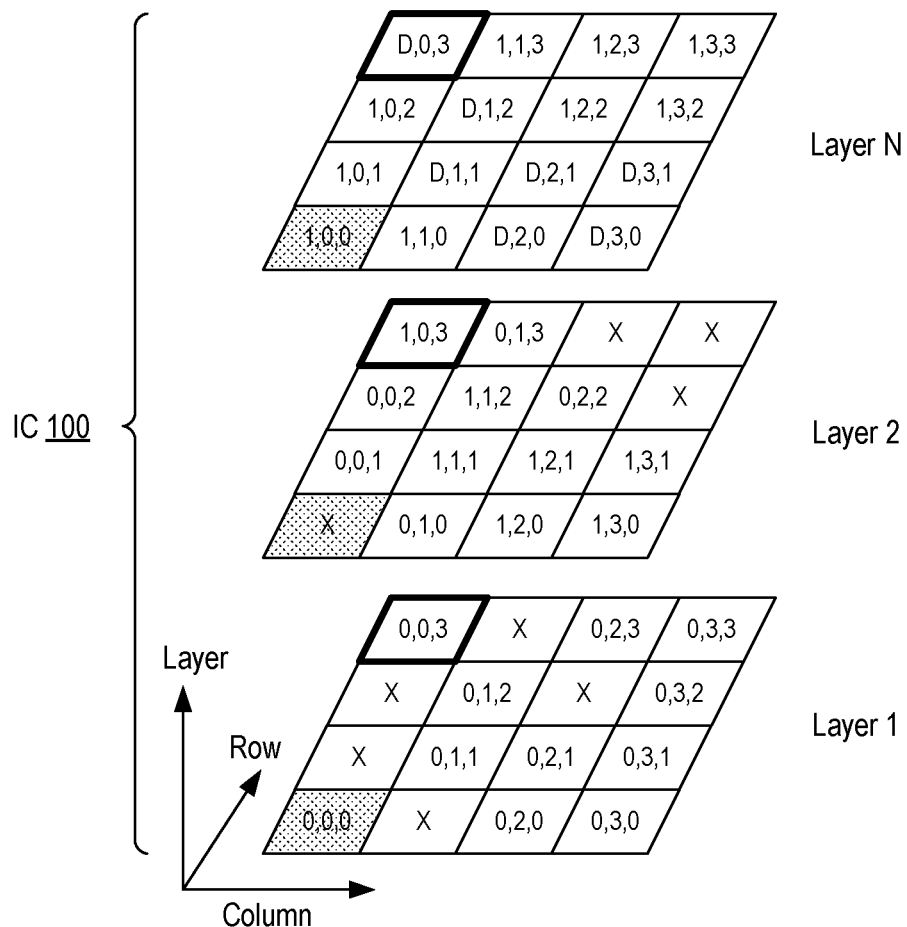
FIG. 2 illustrates another example of the integrated circuit of FIG. 1.
FIG. 3 illustrates an example of a debug signature.

FIG. 2 illustrates another example of the multi-layered IC 100 of FIG. 1. In the example of FIG. 2, each layer is subdivided into a plurality of regions. For purpose of illustration, each layer is subdivided into 16 regions. Each region that is an operational region is labeled with three indices in the format of (L, C, R). Each region that contains a defect and, therefore, is considered defective is labeled with "X." In some examples, the regions represent areas of programmable circuitry in the various layers.

In the case of operational regions, the first character indicates a layer index of IC 100 to which the region is assigned. The layer index in the (L, C, R) format of a given region is not determined by the physical layer in which the region resides. Rather, the layer index of the region is determined by numbering operational regions in a column of vertically aligned regions starting from the bottom or lowest physical layer moving upward toward the top physical layer. The second digit corresponding to C in (L, C, R) indicates the column of the region within a particular layer of IC 100. The third digit corresponding to R in (L, C, R) indicates the row of the region within a particular layer of IC 100.

For purposes of illustration, consider the stacked column of vertically aligned regions indicated with shading in the example of FIG. 2. As defined within this disclosure, the term "stacked column" means a plurality of regions in different layers of a 3D IC that are vertically aligned. A stacked column is to be differentiated from a column, which refers to a column of regions in a particular layer. The lower left region (0,0,0) is an operational region and, being the first operational region moving from the bottom layer toward the top layer has a layer index of 0. Further, the region (0,0,0) is in the 0 column and the 0 row. The shaded region in the second physical layer is defective and is indicated with an "X." The region labeled (1, 0, 0) is an operational region and, being the second operational region moving from the bottom layer toward the top layer is given layer index 1. As can be seen, the C digit of operational regions increases moving from left to right. The R digit of operational regions increases moving from front to back.

By using the partitioning of layers into regions, the yield of 3D ICs can be improved. A 3D IC that is expected to provide N–M layers (e.g., known good layers) for implementing user circuit designs will contain M additional layers. If for each stacked column of regions, there are N–M operational regions, IC 100 is considered good. In some cases, depending on the amount of multiplexing added to IC 100, there may be limitations such as not allowing or tolerating defective regions in a same stacked column in adjacent layers. For example, if two regions in adjacent layers are defective and there is not enough multiplexing available in the IC, the entire IC may be considered to be faulty (or fail). In general, if the 3D IC is capable of providing N–M known good layers and includes one or more stacked columns including at least one additional known good region, such additional known good region(s) may be used for debugging.

IC 100 may be tested so that all regions making up one good layer will be codified to be visible as if each region is from the same physical layer. The codification may be implemented through a software model implemented by the EDA tool or by way of hardware configuration of IC 100. After testing, some regions in the top physical layer may be codified to cover a defective region of another layer beneath in the same stacked column and will appear as if the region(s) belong to that physical layer. Such regions are not available for implementing debug circuitry. An example is the stacked column of shaded regions. Though the top physical layer is operational and otherwise reserved for implementing debug circuitry, region (1, 0, 0) is used to replace the region below labeled "X". Thus, region (1, 0, 0) is not available to implement debug circuitry and is considered part of the layer below (e.g., layer 2) by virtue of the layer index assigned to the region.

In one or more examples, those regions of the debug layer that are required to substitute for a defective region in the same column may be considered or labeled as defective for purposes of indicating whether the region is capable of hosting or implementing debug circuitry. That is, in some cases, the availability of the region in the debug layer can be tracked as opposed to whether the region is operational but unavailable for implementing debug circuitry similar to the case when the region is defective.

Other regions on the top physical layer located in stacked columns with no other defective regions within the stacked column are indicated with a "D" as the first character in the (L, C, R) notation. The stacked column of bolded regions is an example where the region in the top physical layer is available to implement debug circuitry since that region is not needed to replace a defective region of the stacked column.

In the example of FIG. 2, the layer indexing illustrated is provided for purposes of illustration. It should be appreciated that the indexing of layers may proceed from bottom to top or from top to bottom. The debug layer, for example, may be the bottom or a middle layer. Further, the ordering of the respective characters in terms of layer index, column, and then row may be changed.

FIG. 3 illustrates an example of a debug signature 300. Debug signature 300 illustrates which regions of the debug layer of IC 100 are available for debugging and which are not. Each shaded region in debug signature 300 represents a region of the debug layer that is not available to implement debug circuitry. As noted, such regions may be regarded as defective regions whether such regions are defective in and of themselves or are substituting for another defective region beneath in the same stacked column. Those regions that are available to implement debug circuitry are shown and include a "D" as the layer index.

The examples described herein illustrate that debug accessibility in debug-enhanced ICs as described herein is higher than that of a conventional IC. Still, the level of debug accessibility may depend on the locations of the good portion(s) of the debug layer. The amount of accessibility can be extended by using different ICs to implement different probes or sets of probes. Using the debug signatures for ICs as illustrated in FIG. 3, ICs can be grouped into sets that, taken collectively, include all regions. That is, one or more other ICs may be grouped with IC 100 such that each region of the debug layer is available for debugging in at least one of the ICs of the group.

Figure 4A:
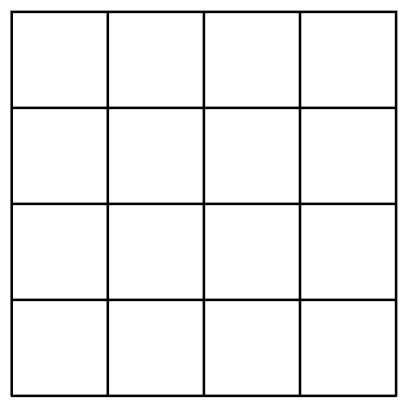
FIGS. 4A, 4B, and 4C illustrate further examples of layer partitioning resulting in regions of different sizes.
Figure 4B:
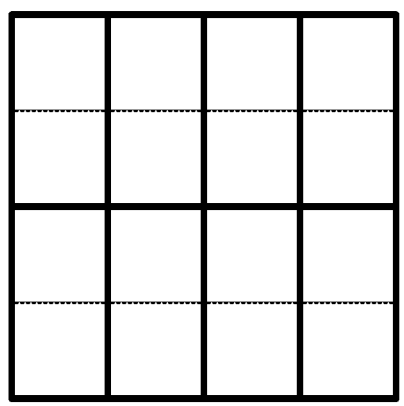
Figure 4C:
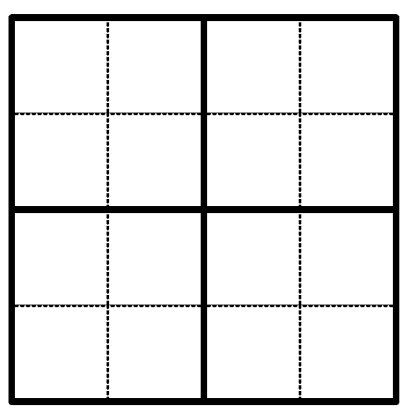

FIGS. 4A, 4B, and 4C illustrate further examples of layer partitioning resulting in sections of different sizes. The sections shown in FIGS. 4A, 4B, and 4C are sized from fine (small) to coarse (large). In general, the larger the sections, the fewer ICs that are needed to make a set of ICs that provides coverage for the entirety of the debug layer.

Whereas a region is determined by the ability to substitute one region for another in a different layer through the availability of suitable multiplexing circuitry and/or logic, the term "section" is a conceptual entity or unit of hierarchy that is a collection of one or more contiguous (e.g., adjacent) regions. A section is typically formed with a rectangular shape. The number of devices of a group of devices that, taken collectively, covers the whole device will equal the number of sections needed to cover an entire layer of the device. Thus, a section that contains multiple regions, e.g., 2×2 regions, will reduce the size of the group of ICs that provides full debugging coverage. In general, the appropriate section size will depend on the size of the 3D IC. While the notion of a "region" is valid outside the context of debugging devices, a "section" may be defined as a particular number of regions to host debug circuitry.

Referring to the example of FIG. 4A, each section is formed of a single region. For purposes of illustration, in the examples of FIGS. 4B and 4C, section boundaries are shown in bold, while region boundaries are shown in dashed lines. Accordingly, in the example of FIG. 4B, each section is formed of 2 regions (e.g., 1×2 regions). In the example of FIG. 4C, each section is formed of 4 regions (e.g., 2×2 regions).

In conventional 3D IC testing, a region located on any additional layer, e.g., the debug layer, due to the cost of testing, is only tested when needed to substitute for another faulty region. In an example implementation, the ICs may be tested to determine each operational region in the debug layer(s). In one aspect, after the ICs are tested and binned as may be performed in the conventional case, some or all of the ICs may be further tested to detect other operational regions in the debugging layer(s).

Figure 5:
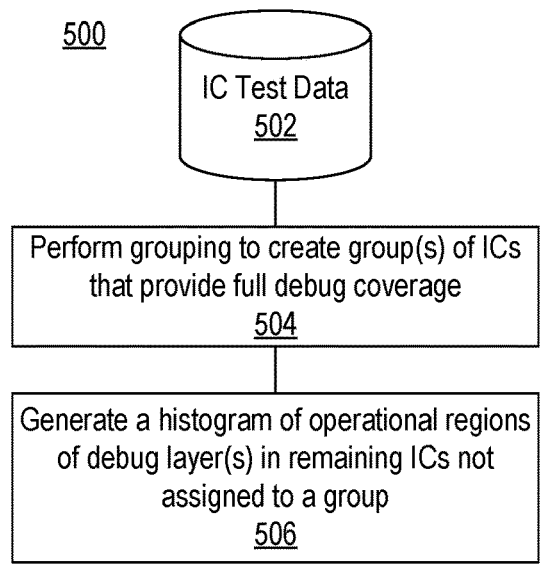
FIG. 5 illustrates an example method of generating groups of ICs.

FIG. 5 illustrates an example method 500 of generating groups of ICs. In the example of FIG. 5, IC test data 502 may be provided to a system capable of grouping ICs. The system may be implemented as a data processing system. An example of a data processing system is described herein in connection with FIG. 11. The IC test data 502 may include the debug signatures of a plurality of 3D ICs. In one aspect, the plurality of 3D ICs may be part of a batch and the grouping described may be performed on a per batch basis. The 3D ICs further may be programmable as previously described.

In block 504, the system is capable of operating on the IC test data 502 for a particular batch of 3D ICs. The 3D ICs are the same with the possible exception of one or more of the 3D ICs including various defects. The system performs grouping to create one or more group(s) of 3D ICs that provide full debug coverage. As defined herein, the term "full debug coverage" means for a selected group of ICs, considered collectively, each region of the debug layer is available for implementing debug circuitry in at least one of the ICs in the group. In other words, the selected group of 3D ICs, when taking the union of the debug signatures of the members of the group, means that all regions of the debug layer are available.

In block 506, the system is capable of generating a histogram of the operational sections of the debug layer for any remaining ICs that have not been assigned to a group. The histogram may be used by the system to determine or guide testing of 3D ICs in subsequent batches. That is, the system may focus testing in a subsequent batch of 3D ICs on those regions of the debug layer that are not represented in the histogram or on those regions that are represented in the remaining 3D ICs in lower numbers. This approach may reduce the costs of sorting 3D ICs into groups.

Figure 6:
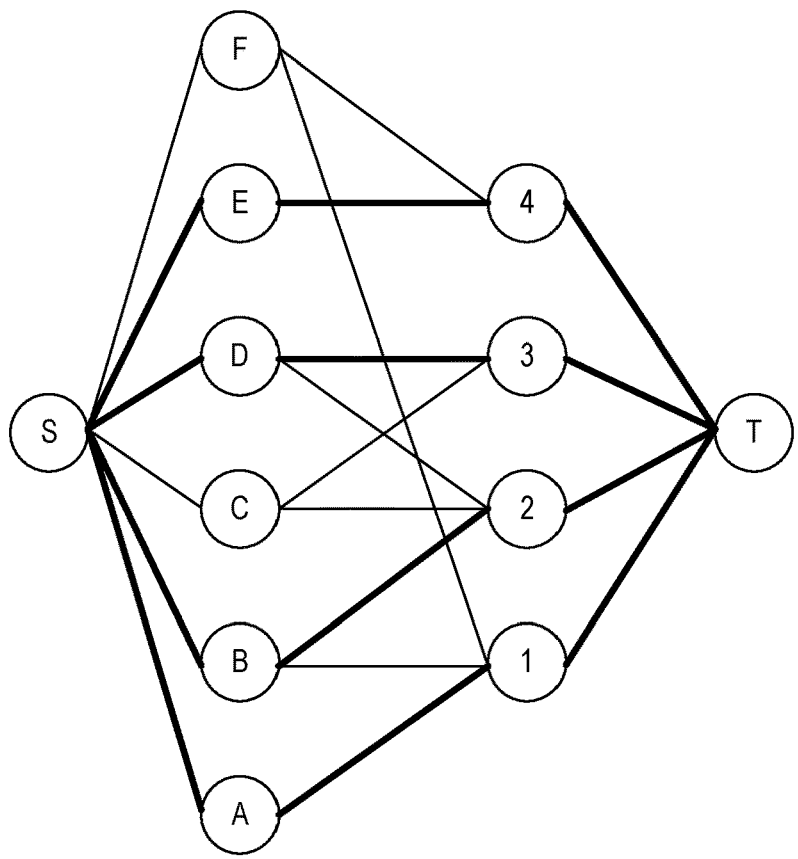
FIG. 6 illustrates an example formulation of grouping as performed by the system as a network flow problem.

In one or more examples, the grouping described in connection with block 504 may be formulated as a network flow problem. FIG. 6 illustrates an example formulation of grouping as performed by the system as a network flow problem. In the example of FIG. 6, there is one node (1, 2, 3, 4) for each section of the debug layer and one node (A, B, C, D, E, F, G) for each 3D IC. Edges connect a 3D IC node with the section nodes for the 3D IC indicating that the 3D IC has operational regions needed by the section. The number of groups obtained equals a minimum flow among the edges from section nodes (1, 2, 3, 4) to the sink node "T." After subtracting the number of groups, the histogram can be constructed from the remaining flows. A 3D IC can cover multiple sections such as 3D ICs B, C, D, and F.

In the example, the flows are shown in bold from the source node "S" to the sink node "T." In the example of FIG. 6, a group is formed of 3D ICs A, B, D, and E where 3D IC A provides section 1; 3D IC B provides section 2, 3D IC D provides section 3, and 3D IC E provides section 4. 3D ICs C and F remain unassigned to a group. In the example, section 2 and 4 are selected for 3D ICs C and F, respectively. Thus, the system determines that testing in the next batch of ICs may focus on testing for sections 1 and 3, which are needed to form a next group of 3D ICs providing full debug coverage considering the availability of 3D ICs C and F.

Figure 7:
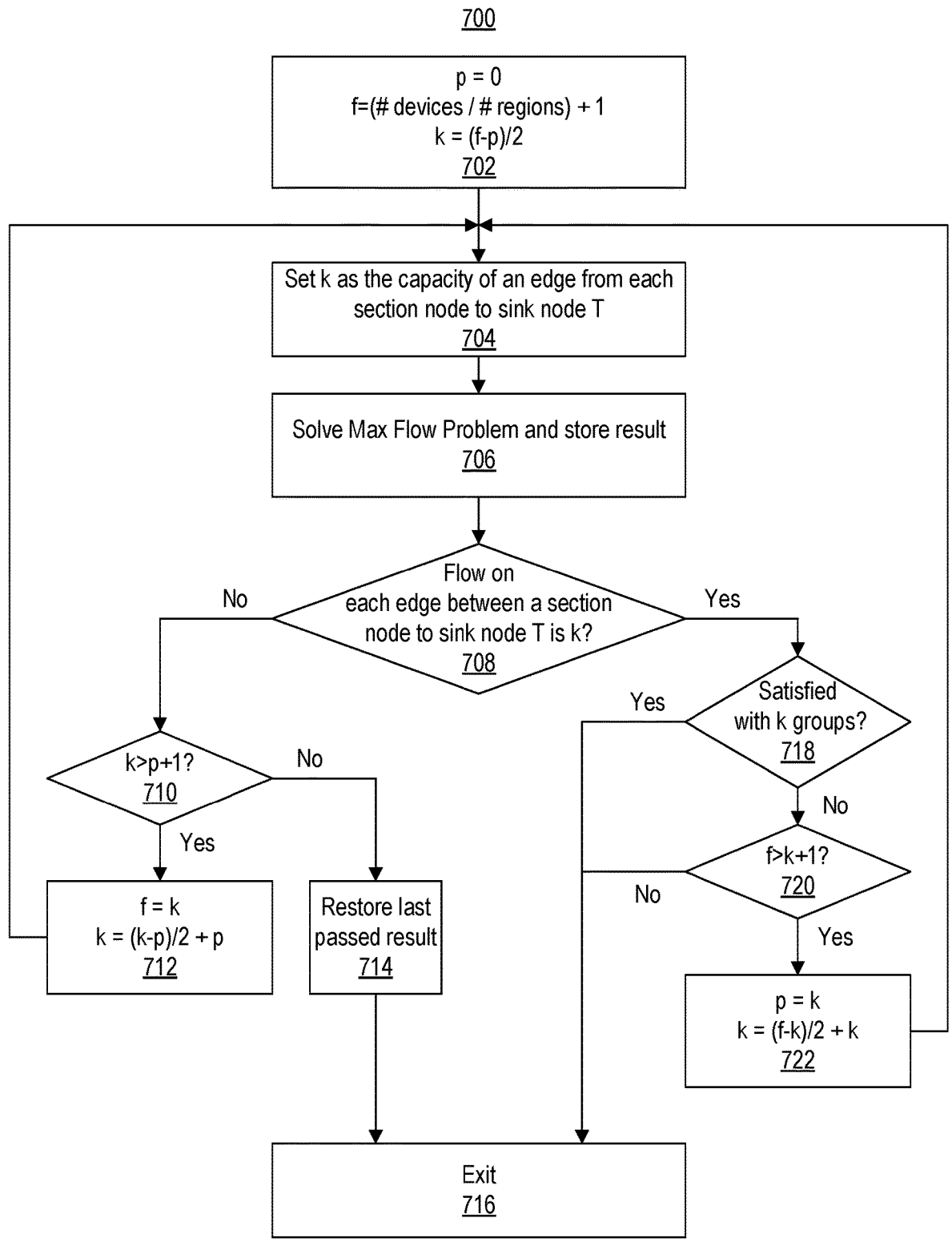
FIG. 7 illustrates an example method of determining a number of groups of ICs that provide full coverage from a given batch of ICs.

FIG. 7 illustrates an example method 700 of determining a number of groups of ICs that provide full coverage from a given batch of ICs. Method 700 may be used to maximize the number of groups that can be formed from a given batch. Such a technique may be used in the early part of the production lifecycle of an IC where yields are typically lower. Method 700 can maximize the number of groups as opposed to the number of known good sections.

Figure 11:
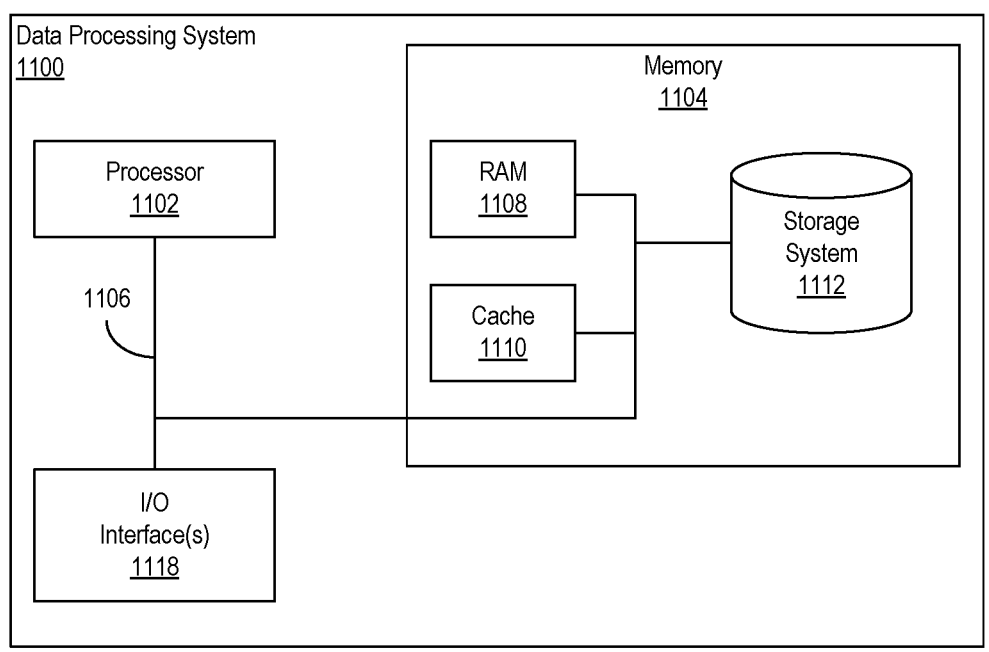
FIG. 11 illustrates an example implementation of a data processing system.

In general, method 700, as performed by a system (e.g., a data processing system as described herein in connection with FIG. 11), is capable of applying a binary search to a modified graph to determine the number of groups that may be generated. The graph may be modified such that the target number of groups is set as the capacity for edges between the section nodes (e.g., 1, 2, 3, 4) and the sink node "T." The system may begin using the variables p, f, and k, where k is the current number of groups under investigation, p is the maximum number of groups seen, and f is the minimum number of groups found impossible.

In block 702, the system sets p equal to 0. The system sets f equal to the number of devices divided by the number of regions plus 1. The system sets k equal to (f−p)/2. In block 704, the system sets k to be the capacity of an edge from each section node to the sink node "T." In block 706, the system solves the max flow problem and stores the result.

In block 708, the system determines whether the flow on each edge between a section node and the sink T is k. In response to determining that the flow on each edge between a region node and the sink T is k, method 700 continues to block 718. The "yes" branch indicates a solution or result obtained in block 706 that is considered a passing result. In the case of following the "yes" branch the result stored in block 706 is annotated as passing. In one or more example implementations, the system can store or keep only the most recent passing result. In response to determining that each edge between a region node and the sink T is not k, method 700 continues to block 710. The "no" branch indicates a solution or result obtained in block 706 that is considered a failed result. In case of following the "no" branch, the result stored in block 706 is annotated as failed. The system may delete a result annotated as failed.

In block 710, the system determines whether the expression "k>p+1" is true. In response to determining that the expression "k>p+1" is true, method 700 continues to block 712. In response to determining that the expression "k>p+1" is false, method 700 continues to block 714.

In block 712, the system sets f equal to k and then sets k equal to (k−p)/2+p. Method 700 then loops back to block 704 to continue.

In block 714, since the most recent iteration of block 706 is considered a failed result, the system restores or recalls the last passed, e.g., the most recent passing result, from block 706 and uses the restored solution as the solution to the max flow problem. In block 716, the system may exit. In one or more other example implementations, if the memory requirements of storing a passing result (e.g., the most recent passing result) is too high, block 714 may be replaced with a block that solves the max flow problem using the last p seen upon reaching block 714.

Continuing with block 718, the system determines whether k groups is a suitable result. In one or more examples, the system may store a threshold to which the system compares k. In response to determining that k is greater than or equal to the threshold, the system determines that the value of k is suitable and method 700 continues to block 716. In block 716, the system exits. As discussed, the "yes" path indicates that the most recent result determined in block 706 is a passing result. In the example, block 718 provides an alternative in which a solution to the max flow problem that is deemed sufficient, having been determined to be a passing result, may be accepted to avoid continuing to iterate to determine a more optimal solution. Block 718 provides an alternative in which runtime of the system may be reduced when a solution deemed sufficient is obtained.

In response to determining that k does not exceed the threshold, method 700 continues from block 718 to block 720 (e.g., in the case where k groups is not suitable). In block 720, the system determines whether the expression "f>k+1" is true. In response to determining that the expression "f>k+1" is true, method 700 continues to block 722. In response to determining that the expression "f>k+1" is false, method 700 continues to block 716. In the example, the most recent result determined by block 706 is used as the solution to the max flow problem. In block 716, the system exits.

In block 722, the system sets p equal to k and then sets k equal to (f−k)/2+k. After block 722, method 700 loops back to block 704 to continue processing.

Figure 8:
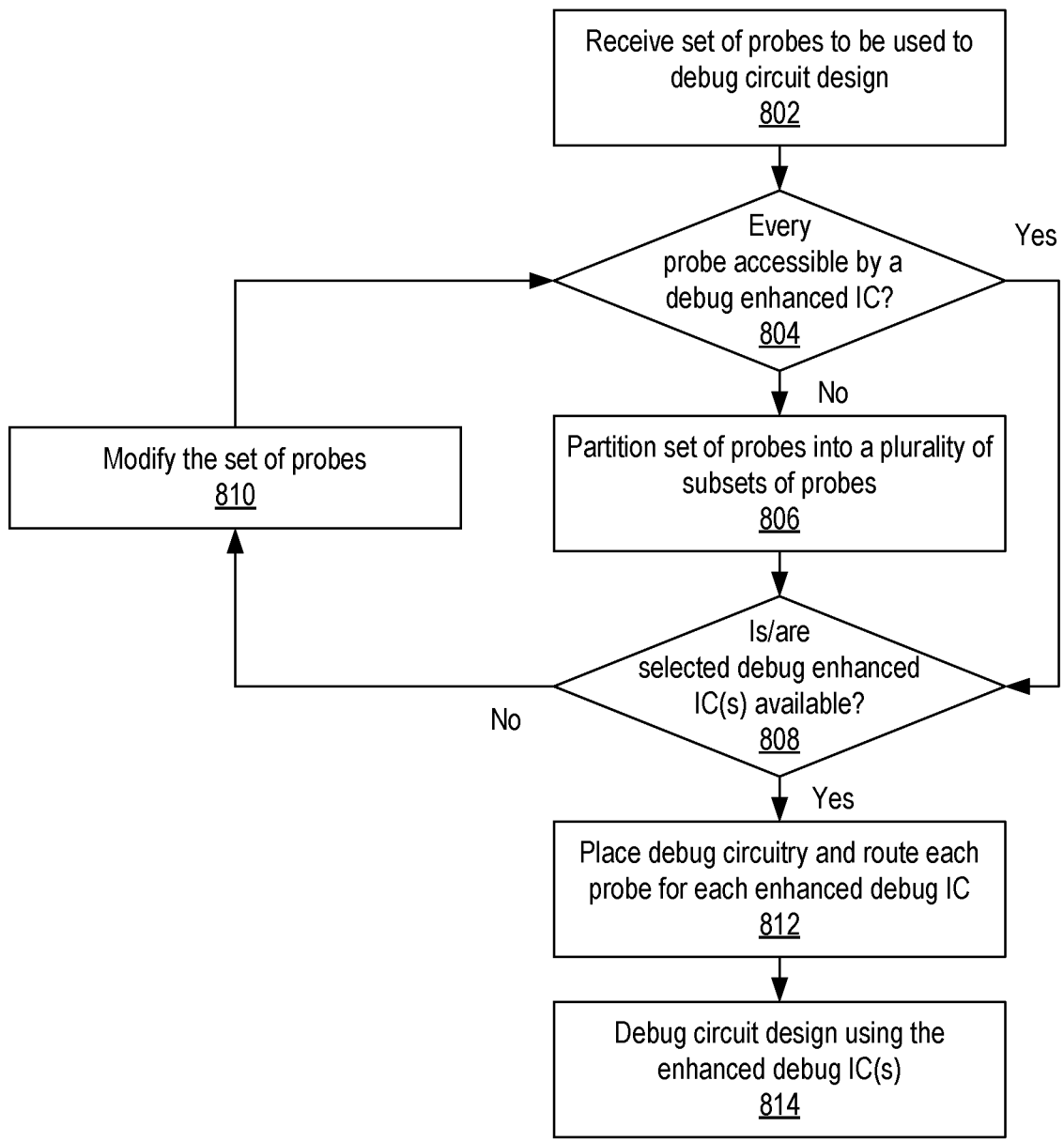
FIG. 8 illustrates an example method of debugging a circuit design using an enhanced debug IC.

FIG. 8 illustrates an example method 800 of debugging a circuit design using an enhanced debug IC. As defined herein, the term "enhanced debug IC" means a 3D IC that includes a debug layer in which one or more regions is/are available to implement debug circuitry. Method 800 may be implemented by a system as described in connection with FIG. 11. Method 800 may begin in a state where a circuit design has been placed and routed for implementation in a target IC that is an enhanced debug IC. The circuit design may have been implemented in a device without the enhanced debug capability, but equivalent to N−M layers of an enhanced debug IC. After observing the unexpected behavior, the implementation can be imported to a device with debug capability for implementing FIG. 8. In the example of FIG. 8, a user wishes to debug the circuit design and has determined a set of probes to be implemented in the target IC. Each probe specifies a particular signal of the circuit design that is to be captured by the implemented probe. In this example, the user may have one or more enhanced debug ICs of a group as previously described. The operations described allow the user to determine whether a single enhanced debug IC may be used to debug the circuit design or a plurality of different such devices are required.

In block 802, the system receives a set of one or more probes to be used to debug the circuit design. As known, each probe is implemented by routing a signal path from the signal of the circuit design specified by the probe back to debug circuitry also implemented in the target IC. An example of debug circuitry is an on-chip logic analyzer. Another example of debug circuitry is a debug hub capable of connecting to one or more sub-circuits, accelerators, and/or cores. In one or more example implementations, the debug circuitry is capable of storing probed data and/or outputting such data to an external system.

In block 804 the system determines whether a single enhanced debug IC is capable of implementing each probe of the set of probes from block 802. In one aspect, each enhanced debug IC of a group may provide a single debug region that is capable of implementing debug circuitry. Given the known architecture of the target IC and the target IC being an enhanced debug IC, the system is capable of tracing each probe of the set from the signal of the circuit design specified by the probe, as placed and routed in the target IC, back to a single debug section.

For example, the system may iteratively trace each probe back to a first debug section of the target IC. If the system is able to trace each probe back to the first debug section, the system determines that an enhanced debug IC that provides the first debug section is capable of implementing every probe of the set of probes. If the system is unable to trace each probe back to the first debug section, the system may continue by trying to trace each probe back to the second debug section, then the third debug section, and so forth. This allows the system to determine whether a single target IC having a particular debug section available is capable of implementing all of the probes of the set. That is, the system determines whether every probe of the set is accessible, or may be implemented, using a single target IC with a particular debug section.

In response to determining that a single target IC is capable of implementing all probes of the set, method 800 continues to block 808. In response to determining that a single target IC is not capable of implementing every probe in the set, method 800 continues to block 806.

In block 806, the system is capable of partitioning the set of probes into a plurality of subsets of probes. Each subset of probes generated by the system may correspond to a different enhanced debug IC of a group of enhanced debug ICs that provides full debug coverage. That is, if each enhanced debug IC provides a particular (e.g., a single)

debug section, each subset of probe points corresponds to a particular enhanced debug IC and the particular debug section provided by that particular enhanced debug IC. The partitioning generates subsets of probes and assigns the subsets to different target ICs based on the likelihood of the probe being routable to the debug section provided by the target IC. Block 804 allows the set of probes desired by a user for debugging a circuit design to be apportioned out over a plurality of enhanced debug ICs. In one aspect, any routing determinations and/or data generated by the system in block 804 may be stored and used in block 806.

In block 808, the system determines whether an enhanced debug IC having a debug region section of connecting to each probe of the set is available. For example, the user may have each enhanced debug IC of a group of enhanced debug ICs that provides full debug coverage. Alternatively, the user may have access to only a subset of a group of enhanced debug ICs such that full debug coverage is not available to the user. In the latter case, it may be that the user does not have access to one or more enhanced debug ICs with the necessary debug section to implement debug circuitry to implement each probe of the set.

In one aspect, the system may maintain a list of enhanced debug ICs that are owned or available to the user along with the particular debug section available or provided by each such enhanced debug IC. In response to determining that the user does not have access to an enhanced debug IC or enhanced debug ICs capable of implementing every probe of the set, method 800 continues to block 810. In block 810, the user may modify the set of probes. For example, the system may notify the user that one or more enhanced debug ICs are not available to implement one or more probes of the set. The system may inform the user as to the particular probes that may not be implemented. In response, the user may reduce the number of probes in the set to see whether the resulting set of probes may be implemented by a single enhanced debug IC or implemented by a plurality of enhanced debug ICs to which the user does have access.

In response to determining that the set of probes may be implemented by one or more enhanced debug ICs to which the user has access, method 800 continues to block 812. In block 812, the system is capable of placing the debug circuitry and routing the probes for each enhanced debug IC to be used for the set of probes. The system is capable of combining routes to implement probes to coexist with the routes of the circuit design.

In block 814, the circuit design may be debugged using the enhanced debug IC(s). That is, using the enhanced debug IC(s), the debug circuitry may be operated to capture values of the probed signals of the circuit design.

In performing method 800, the system is capable of generating any of a variety of different notifications for the user. In one aspect, the system is capable of informing the user whether all probes of the set may be implemented by a single enhanced debug IC. The system may also indicate the particular enhanced debug IC that should be used (e.g., the particular debug section). In another example, the system is capable of providing a notification of the subsets of probes generated and the particular enhanced debug ICs correlated with each subset.

Figure 9:
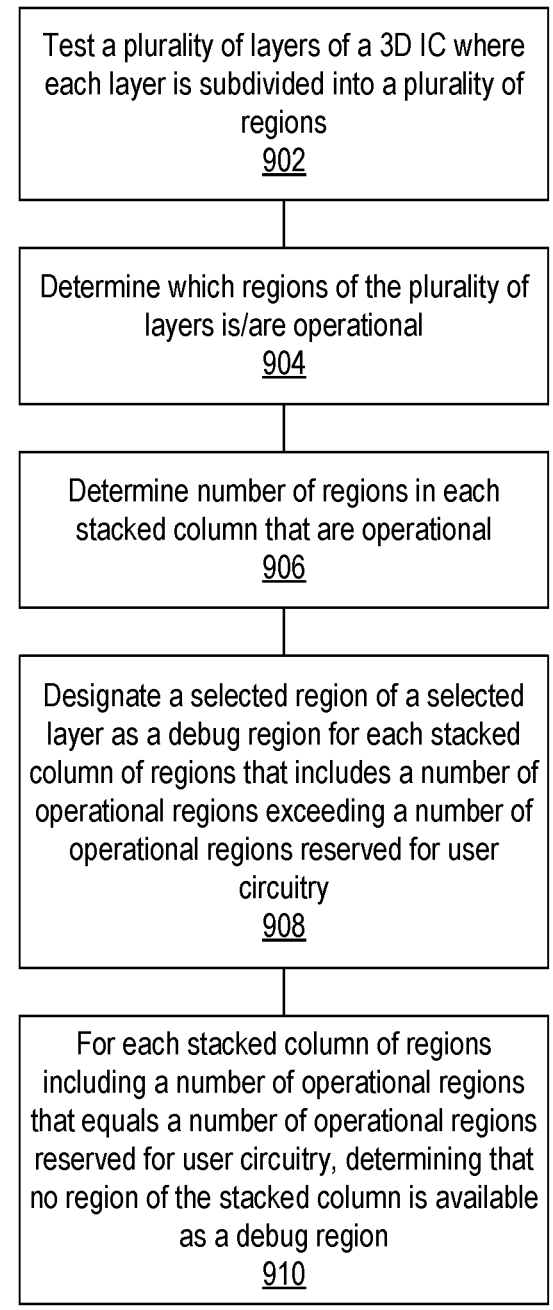
FIG. 9 illustrates an example method of determining which regions of a 3-dimensional (3D) IC may be used to implement debug circuitry.

FIG. 9 illustrates an example method of determining which regions of a 3D IC may be used to implement debug circuitry. The operations described in connection with FIG. 9 may be performed to determine whether a given 3D IC may be used as an enhanced debug IC. Method 900 may be performed by a system that includes semiconductor test equipment. The system may include or be coupled to a data processing system. Semiconductor test equipment, sometimes referred to as an IC tester or automated test equipment (ATE), is a system for providing electrical signals to a semiconductor device to compare output signals against expected values for the purpose of testing whether the device works as specified in the design specifications for the device. An example of a data processing system is described herein in connection with FIG. 11.

In block 902, the system tests a plurality of layers of an 3D IC having a plurality of layers as described herein. Each layer of the 3D IC is subdivided into a plurality of regions. The regions from one layer of the 3D IC to another are aligned to form stacked columns.

In one aspect, the system is capable of testing each region of each layer of the plurality of layers of the 3D IC. For purposes of discussion with reference to FIG. 9, it may be assumed that the 3D IC undergoing test has passed in that the 3D IC includes a minimum number of regions that are operational to provide the device as a 3D IC having a minimum number of layers available for implementing user circuitry. That is, those 3D ICs that are not suitable for sale to consumers need not be considered for use as an enhanced debug IC and/or undergo the processing described in connection with FIG. 9.

In block 904, the system determines which regions of the plurality of layers are operational. In block 906, the system determines the number of regions in each stacked column that are operational.

In block 908, for each stacked column of regions across the plurality of layers that includes a number of operational regions that exceeds a number of operational regions reserved for user circuitry, the system designates a selected region of a selected layer of the plurality of layers as a debug region. For example, if the 3D IC is designated as a two-layer IC meaning that the 3D IC is to be provided to end users with two layers available to implement user circuitry, to include a debug region, a stacked column of regions must include at least 3 operational regions.

In block 910, for each stacked column of regions across the plurality of layers including a number of operational regions that equals a number of operational regions reserved for user circuitry, the system determines that no region of the stacked column is available as a debug region. In this case, the stacked column of regions is said to lack a debug region.

Subsequently, while the 3D IC is used to implement a user circuit design, the particular EDA tool being used is configured to identify particular 3D ICs that are enhanced debug ICs. In such cases, the system is capable of disallowing implementation of user circuitry in any debug region. That is, in performing placement and routing, the EDA tool does not implement any portion of the circuit design (e.g., user circuit design) in a debug region. Further, the EDA tool only permits the implementation of debug circuitry in a debug region. That is, the EDA tool may permit only debug circuitry to be implemented in a debug region of the 3D IC.

In one aspect, in the case where the set of probes to be implemented to debug a circuit design cannot be implemented by a single enhanced debug IC, the system is capable of partitioning the set of probes for the user circuitry into a plurality of subsets. Each subset of probes corresponds to a different 3D IC that provides a different debug region.

In another example, as part of IC testing, enhanced debug ICs may be grouped to provide complete debug coverage. For example, the system is capable of assigning a plurality of 3D ICs, each being an enhanced debug IC, to a group such that, the debug regions of the group of 3D ICs, when taken collectively, form an entire layer of debug regions. As discussed, a histogram may be generated that specifies available debug section for 3D ICs of the plurality of 3D ICs that have not been assigned to a group.

In one or more example implementations, different ones of the 3D ICs of a group may be made available using System-on-Module (SoM) technology. SoM technology allows a primary card that couples to a data processing system to be further coupled and/or communicatively linked to a secondary card (e.g., sometimes referred to as a "daughter card"). By providing a primary card and allowing one or more other secondary cards to be communicatively linked and/or coupled to the primary card, users may perform debugging using a plurality of different enhanced debug ICs of a given group (or a subset of a group). For example, different ones of the enhanced debug ICs may be provided on different secondary cards and coupled to the primary card using SoM technology. This allows a user to utilize different enhanced debug ICs with different debug regions available therein with relative ease.

FIG. 10 illustrates an example method 1000 of implementing debug circuitry within a 3D IC. The 3D IC is an enhanced debug IC. Method 1000 may be performed by a system such as the example data processing system described in connection with FIG. 11.

In block 1002, the system receives a plurality of probes for signals of a user circuit design that is placed and routed for implementation within the 3D IC. The 3D IC is one of a plurality of 3D ICs. Further, each 3D IC of the plurality of 3D ICs provides one or more different debug sections (e.g., is an enhanced debug IC).

In block 1004, the system partitions the plurality of probes into a plurality of subsets. Each subset corresponds to a different one of the plurality of 3D ICs. By extension, each subset corresponds to, or is mapped to, a particular debug section.

In block 1006, the system places debug circuitry within respective ones of the different debug section of the plurality of 3D ICs. The system, for example, assigns debug circuitry to the debug section of each of the plurality of debug section. The debug circuitry for each respective debug section may be configured for processing the particular subset of probes that have been assigned to the respective 3D ICs and corresponding debug regions of the section.

In block 1008, the system is capable of routing the plurality of subsets of probes to the placed debug circuitry for respective ones of the plurality of 3D ICs. For example, for each 3D IC, the system routes the probes to be implemented in the 3D IC to the placed debug circuitry in the debug section of the 3D IC. Having placed the debug circuitry and routed the probes, each of the 3D ICs may be loaded with configuration data (e.g., the placed and routed circuit design including the debug circuitry and probes) as needed to debug the circuit design.

In one or more examples, the system is capable of determining whether any particular 3D IC of the plurality of 3D ICs is capable of implementing every probe of the plurality of probes.

In one or more examples, the system is capable of determining whether the plurality of 3D ICs, taken collectively, are capable of implementing the plurality of probes.

FIG. 11 illustrates an example implementation of a data processing system 1100. As defined herein, the term "data processing system" means one or more hardware systems configured to process data, each hardware system including at least one processor and memory, wherein the processor is programmed with computer-readable instructions that, upon execution, initiate operations. Data processing system 1100 can include a processor 1102, a memory 1104, and a bus 1106 that couples various system components including memory 1104 to processor 1102.

Processor 1102 may be implemented as one or more processors. In an example, processor 1102 is implemented as a central processing unit (CPU). Processor 1102 may be implemented as one or more circuits capable of carrying out instructions contained in program code. The circuit may be an IC or embedded in an IC. Processor 1102 may be implemented using a complex instruction set computer architecture (CISC), a reduced instruction set computer architecture (RISC), a vector processing architecture, or other known architectures. Example processors include, but are not limited to, processors having an x86 type of architecture (IA-32, IA-64, etc.), Power Architecture, ARM processors, and the like.

Bus 1106 represents one or more of any of a variety of communication bus structures. By way of example, and not limitation, bus 1106 may be implemented as a Peripheral Component Interconnect Express (PCIe) bus. Data processing system 1100 typically includes a variety of computer system readable media. Such media may include computer-readable volatile and non-volatile media and computer-readable removable and non-removable media.

Memory 1104 can include computer-readable media in the form of volatile memory, such as random-access memory (RAM) 1108 and/or cache memory 1110. Data processing system 1100 also can include other removable/non-removable, volatile/non-volatile computer storage media. By way of example, storage system 1112 can be provided for reading from and writing to a non-removable, non-volatile magnetic and/or solid-state media (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to bus 1106 by one or more data media interfaces. Memory 1104 is an example of at least one computer program product.

Memory 1104 is capable of storing computer-readable program instructions that are executable by processor 1102. For example, the computer-readable program instructions can include an operating system, one or more application programs, other program code, and program data. Processor 1102, in executing the computer-readable program instructions, is capable of performing the various operations described herein that are attributable to a computer. In one or more examples, the compute-readable program instructions may include EDA tool software and/or program code capable of performing an implementation flow on a circuit design (e.g., synthesis, placement, routing, and/or configuration data/bitstream generation).

It should be appreciated that data items used, generated, and/or operated upon by data processing system 1100 are functional data structures that impart functionality when employed by data processing system 1100. As defined within this disclosure, the term "data structure" means a physical implementation of a data model's organization of data within a physical memory. As such, a data structure is formed of specific electrical or magnetic structural elements in a memory. A data structure imposes physical organization on the data stored in the memory as used by an application program executed using a processor.

Data processing system 1100 may include one or more Input/Output (I/O) interfaces 1118 communicatively linked to bus 1106. I/O interface(s) 1118 allow data processing system 1100 to communicate with one or more external devices and/or communicate over one or more networks such as a local area network (LAN), a wide area network (WAN), and/or a public network (e.g., the Internet). Examples of I/O interfaces 1118 may include, but are not limited to, network cards, modems, network adapters, hardware controllers, etc. Examples of external devices also may include devices that allow a user to interact with data processing system 1100 (e.g., a display, a keyboard, and/or a pointing device) and/or other devices such as an accelerator card (e.g., a primary board and/or secondary board(s) including one or more enhanced debug ICs). Notifications described herein may be provided (e.g., displayed, played audibly, etc.) via one or more of the noted external devices.

Data processing system 1100 is only one example implementation. Data processing system 1100 can be practiced as a standalone device (e.g., as a user computing device or a server, as a bare metal server), in a cluster (e.g., two or more interconnected computers), or in a distributed cloud computing environment (e.g., as a cloud computing node) where tasks are performed by remote processing devices that are linked through a communications network. In a distributed cloud computing environment, program modules may be located in both local and remote computer system storage media including memory storage devices.

The example of FIG. 11 is not intended to suggest any limitation as to the scope of use or functionality of example implementations described herein. Data processing system 1100 is an example of computer hardware that is capable of performing the various operations described within this disclosure. In this regard, data processing system 1100 may include fewer components than shown or additional components not illustrated in FIG. 11 depending upon the particular type of device and/or system that is implemented. The particular operating system and/or application(s) included may vary according to device and/or system type as may the types of I/O devices included. Further, one or more of the illustrative components may be incorporated into, or otherwise form a portion of, another component. For example, a processor may include at least some memory.

While the disclosure concludes with claims defining novel features, it is believed that the various features described within this disclosure will be better understood from a consideration of the description in conjunction with the drawings. The process(es), machine(s), manufacture(s) and any variations thereof described herein are provided for purposes of illustration. Specific structural and functional details described within this disclosure are not to be interpreted as limiting, but merely as a basis for the claims and as a representative basis for teaching one skilled in the art to variously employ the features described in virtually any appropriately detailed structure. Further, the terms and phrases used within this disclosure are not intended to be limiting, but rather to provide an understandable description of the features described.

For purposes of simplicity and clarity of illustration, elements shown in the figures have not necessarily been drawn to scale. For example, the dimensions of some of the elements may be exaggerated relative to other elements for clarity. Further, where considered appropriate, reference numbers are repeated among the figures to indicate corresponding, analogous, or like features.

As defined herein, the singular forms "a," "an," and "the" are intended to include the plural forms as well, unless the context clearly indicates otherwise.

As defined herein, the term "approximately" means nearly correct or exact, close in value or amount but not precise. For example, the term "approximately" may mean that the recited characteristic, parameter, or value is within a predetermined amount of the exact characteristic, parameter, or value.

As defined herein, the terms "at least one," "one or more," and "and/or," are open-ended expressions that are both conjunctive and disjunctive in operation unless explicitly stated otherwise. For example, each of the expressions "at least one of A, B, and C," "at least one of A, B, or C," "one or more of A, B, and C," "one or more of A, B, or C," and "A, B, and/or C" means A alone, B alone, C alone, A and B together, A and C together, B and C together, or A, B and C together.

As defined herein, the term "automatically" means without human intervention. As defined herein, the term "user" means a human being.

As defined herein, the term "computer-readable storage medium" means a storage medium that contains or stores program instructions for use by or in connection with an instruction execution system, apparatus, or device. As defined herein, a "computer-readable storage medium" is not a transitory, propagating signal per se. The various forms of memory, as described herein, are examples of computer-readable storage media. A non-exhaustive list of examples of computer-readable storage media include an electronic storage device, a magnetic storage device, an optical storage device, an electromagnetic storage device, a semiconductor storage device, or any suitable combination of the foregoing. A non-exhaustive list of more specific examples of a computer-readable storage medium may include: a portable computer diskette, a hard disk, a RAM, a read-only memory (ROM), an erasable programmable read-only memory (EPROM or Flash memory), an electronically erasable programmable read-only memory (EEPROM), a static random-access memory (SRAM), a portable compact disc read-only memory (CD-ROM), a digital versatile disk (DVD), a memory stick, or a floppy disk.

As defined herein, the term "if" means "when" or "upon" or "in response to" or "responsive to," depending upon the context. Thus, the phrase "if it is determined" or "if [a stated condition or event] is detected" may be construed to mean "upon determining" or "in response to determining" or "upon detecting [the stated condition or event]" or "in response to detecting [the stated condition or event]" or "responsive to detecting [the stated condition or event]" depending on the context.

As defined herein, the term "responsive to" and similar language as described above, e.g., "if," "when," or "upon," means responding or reacting readily to an action or event. The response or reaction is performed automatically. Thus, if a second action is performed "responsive to" a first action, there is a causal relationship between an occurrence of the first action and an occurrence of the second action. The term "responsive to" indicates the causal relationship.

As defined herein, the term "substantially" means that the recited characteristic, parameter, or value need not be achieved exactly, but that deviations or variations, including for example, tolerances, measurement error, measurement accuracy limitations, and other factors known to those of skill in the art, may occur in amounts that do not preclude the effect the characteristic was intended to provide.

The terms first, second, etc., may be used herein to describe various elements. These elements should not be limited by these terms, as these terms are only used to distinguish one element from another unless stated otherwise or the context clearly indicates otherwise.

A computer program product may include a computer-readable storage medium (or media) having computer-readable program instructions thereon for causing a processor to carry out aspects of the inventive arrangements described herein. Within this disclosure, the term "program code" is used interchangeably with the term "program instructions." Computer-readable program instructions described herein may be downloaded to respective computing/processing devices from a computer-readable storage medium or to an external computer or external storage device via a network, for example, the Internet, a LAN, a WAN and/or a wireless network. The network may include copper transmission cables, optical transmission fibers, wireless transmission, routers, firewalls, switches, gateway computers and/or edge devices including edge servers. A network adapter card or network interface in each computing/processing device receives computer-readable program instructions from the network and forwards the computer-readable program instructions for storage in a computer-readable storage medium within the respective computing/processing device.

Computer-readable program instructions for carrying out operations for the inventive arrangements described herein may be assembler instructions, instruction-set-architecture (ISA) instructions, machine instructions, machine dependent instructions, microcode, firmware instructions, or either source code or object code written in any combination of one or more programming languages, including an object-oriented programming language and/or procedural programming languages. Computer-readable program instructions may include state-setting data. The computer-readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a LAN or a WAN, or the connection may be made to an external computer (for example, through the Internet using an Internet Service Provider). In some cases, electronic circuitry including, for example, programmable logic circuitry, an FPGA, or a PLA may execute the computer-readable program instructions by utilizing state information of the computer-readable program instructions to personalize the electronic circuitry, in order to perform aspects of the inventive arrangements described herein.

Certain aspects of the inventive arrangements are described herein with reference to flowchart illustrations and/or block diagrams of methods, apparatus (systems), and computer program products. It will be understood that each block of the flowchart illustrations and/or block diagrams, and combinations of blocks in the flowchart illustrations and/or block diagrams, may be implemented by computer-readable program instructions, e.g., program code.

These computer-readable program instructions may be provided to a processor of a computer, special-purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer-readable program instructions may also be stored in a computer-readable storage medium that can direct a computer, a programmable data processing apparatus, and/or other devices to function in a particular manner, such that the computer-readable storage medium having instructions stored therein comprises an article of manufacture including instructions which implement aspects of the operations specified in the flowchart and/or block diagram block or blocks.

The computer-readable program instructions may also be loaded onto a computer, other programmable data processing apparatus, or other device to cause a series of operations to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various aspects of the inventive arrangements. In this regard, each block in the flowchart or block diagrams may represent a module, segment, or portion of instructions, which comprises one or more executable instructions for implementing the specified operations.

In some alternative implementations, the operations noted in the blocks may occur out of the order noted in the figures. For example, two blocks shown in succession may be executed substantially concurrently, or the blocks may sometimes be executed in the reverse order, depending upon the functionality involved. In other examples, blocks may be performed generally in increasing numeric order while in still other examples, one or more blocks may be performed in varying order with the results being stored and utilized in subsequent or other blocks that do not immediately follow. It will also be noted that each block of the block diagrams and/or flowchart illustration, and combinations of blocks in the block diagrams and/or flowchart illustration, may be implemented by special purpose hardware-based systems that perform the specified functions or acts or carry out combinations of special purpose hardware and computer instructions.

What is claimed is:

1. A method, comprising:
    testing a plurality of layers of a 3-dimensional integrated circuit (3D IC), wherein each layer is subdivided into a plurality of regions, wherein the regions from one layer to another are aligned within stacked columns;
    determining which regions of the plurality of layers are operational;
    determining a number of operational regions in each stacked column; and
    for each stacked column including a number of operational regions exceeding a number of operational regions reserved for user circuitry, designating a selected region of a selected layer of the plurality of layers as a debug region.

2. The method of claim 1, wherein the testing includes testing each region of each of the plurality of layers.

3. The method of claim 1, further comprising:
    for each stacked column of regions including a number of operational regions that equals a number of operational regions reserved for the user circuitry, determining that no region of the stacked column is available as a debug region.

4. The method of claim 1, further comprising:
    disallowing implementation of the user circuitry in any debug region.

5. The method of claim 4, further comprising:
permitting only debug circuitry to be implemented in any debug region.

6. The method of claim 1, wherein the 3D IC is one of a plurality of 3D ICs, the method further comprising:
assigning selected ones of the 3D ICs of the plurality of 3D ICs to a group such that, for the selected layer of the plurality of layers, each region of the selected layer is available as a debug region based on a union of debug signatures of the plurality of 3D ICs of the group.

7. The method of claim 6, further comprising:
generating a histogram specifying available debug regions for 3D ICs of the plurality of 3D ICs not assigned to the group.

8. The method of claim 6, further comprising:
partitioning a set of probes for the user circuitry into a plurality of subsets, wherein each subset corresponds to a different 3D IC that provides a different debug region.

9. An integrated circuit, comprising:
a plurality of layers, wherein each layer is subdivided into a plurality of regions such that the regions from one layer to another are aligned within stacked columns;
wherein, based on testing of the plurality of layers, a number of regions of each layer of the plurality of layers within each stacked column are designated as operational; and
wherein, for each stacked column including a number of operational regions exceeding a number of operational regions reserved for user circuitry, a selected region of a selected layer of the plurality of layers is designated as a debug region.

10. The integrated circuit of claim 9, further comprising:
debug circuitry implemented in at least one debug region; and
the user circuitry implemented within one or more non-debug regions of the plurality of layers;
wherein the debug circuitry is operable to probe signals of the user circuitry.

11. The integrated circuit of claim 9, wherein each layer includes programmable circuitry.

12. The integrated circuit of claim 9, wherein an entirety of a selected layer of the plurality of layers is reserved for debugging.

13. The integrated circuit of claim 9, wherein a portion of a selected layer of the plurality of layers is reserved for debugging.

14. The integrated circuit of claim 9, wherein each stacked column of regions that includes a number of operational regions of different layers that is equal to a number of operational regions reserved for the circuitry lacks a debug region.

15. The integrated circuit of claim 9, wherein the integrated circuit (IC) is a 3D IC assigned to a group of a plurality of 3D ICs in which a union of debug signatures of the 3D ICs of the group indicate that, for the group, all regions of the selected layer are available for debugging.

16. The integrated circuit of claim 15, wherein the group of 3D ICs is used to implement a user circuit design in which a set of probes for the user circuitry of the user circuit design is partitioned into a plurality of subsets, and wherein each subset is implemented in a different debug region located in a different one of the plurality of 3D ICs of the group.

* * * * *